United States Patent
Berney

(10) Patent No.: US 6,642,077 B1
(45) Date of Patent: Nov. 4, 2003

(54) METHOD FOR MANUFACTURING AND ASSEMBLING PHOTOVOLTAIC CELLS

(75) Inventor: Jean-Claude Berney, Morges (CH)

(73) Assignee: Asulab S.A., Bienne (CH)

( * ) Notice: Subject to any disclaimer, the term of this patent is extended or adjusted under 35 U.S.C. 154(b) by 0 days.

(21) Appl. No.: 09/646,837

(22) PCT Filed: Mar. 19, 1999

(86) PCT No.: PCT/EP99/01886
§ 371 (c)(1),
(2), (4) Date: Sep. 22, 2000

(87) PCT Pub. No.: WO99/49524
PCT Pub. Date: Sep. 30, 1999

(30) Foreign Application Priority Data

Mar. 25, 1998 (CH) ................................. 699/98

(51) Int. Cl.⁷ .................. H01L 31/18; H01L 31/20; H01L 31/042
(52) U.S. Cl. ................... 438/66; 438/62; 438/67; 438/68; 438/80; 136/244; 136/251; 136/256; 136/255; 257/443; 257/458
(58) Field of Search ............. 438/62, 67, 66, 438/68, 80; 136/244, 251, 256, 255; 257/443, 458

(56) References Cited

U.S. PATENT DOCUMENTS 5,021,099 A * 6/1991 Kim et al. ................ 136/249
5,457,057 A   10/1995 Nath et al.
5,516,704 A    5/1996 Yoshida
6,204,079 B1 * 3/2001 Aspar et al. ................ 438/25
6,380,477 B1 * 4/2002 Curtin ....................... 136/244

FOREIGN PATENT DOCUMENTS

EP    197 679 A2    3/1986

OTHER PUBLICATIONS

Patent Abstracts of Japan, vol. 011, No. 198 (E–519), Jun. 25, 1987 Abstract for JP 62 025463 (Matsushita Electric Ind Co., Ltd.), Feb. 3, 1987.

Patent Abstracts of Japan, vol. 004, No. 162 (E–033), Nov. 12, 1980 Abstract for JP 55 111181 (NEC Corp) Aug. 27, 1980.

* cited by examiner

*Primary Examiner*—Alan Diamond
(74) *Attorney, Agent, or Firm*—Sughrue Mion, PLLC

(57) ABSTRACT

The invention concerns a method for manufacturing and assembling individual photovoltaic silicon cells on a metal substrate, including the operations of: making a metal plate (25) provided with cut out portions (26, 29) separated from each other by points of attachment (27) and delimiting the bases of a plurality of cells; depositing a stack of silicon layers then a metallization on said plate in order to form a group of individual cells (28a–b–c–d); transferring said group onto an interconnection support (30); and perforating the points of attachment in order to separate the cells from the rest of the plate.

15 Claims, 6 Drawing Sheets

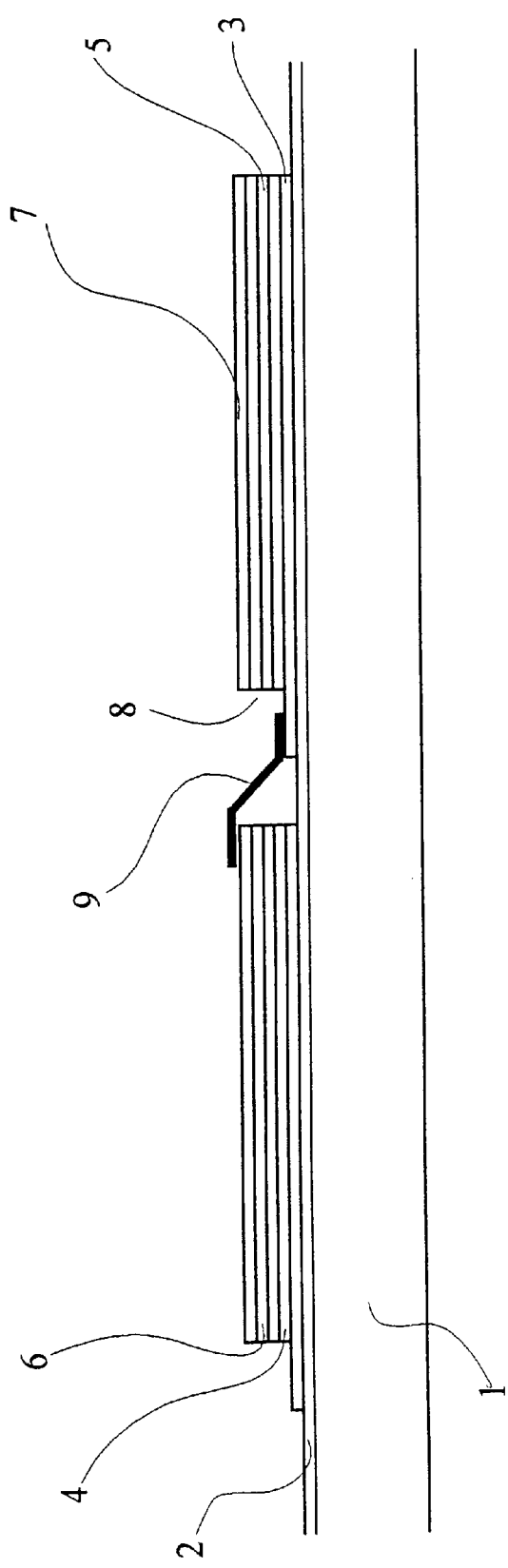
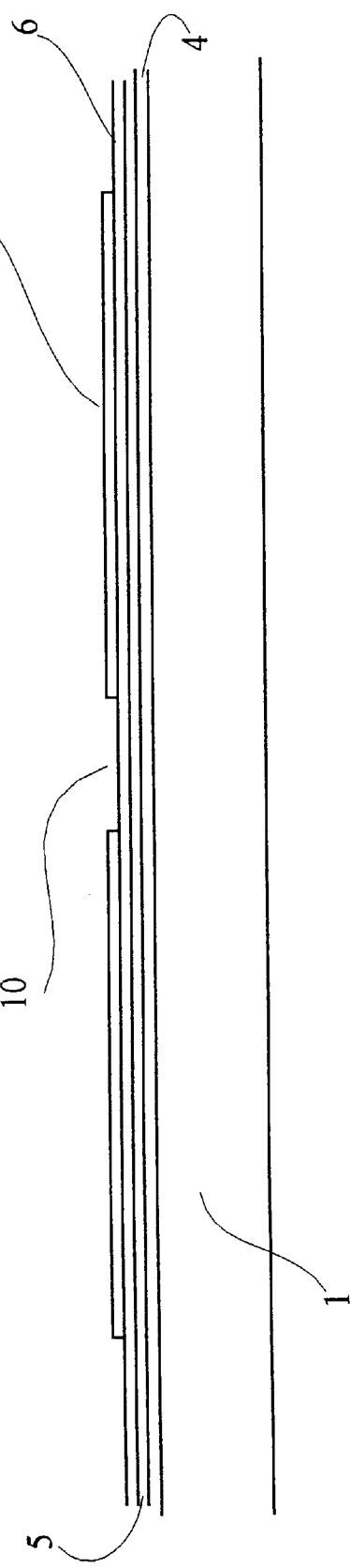

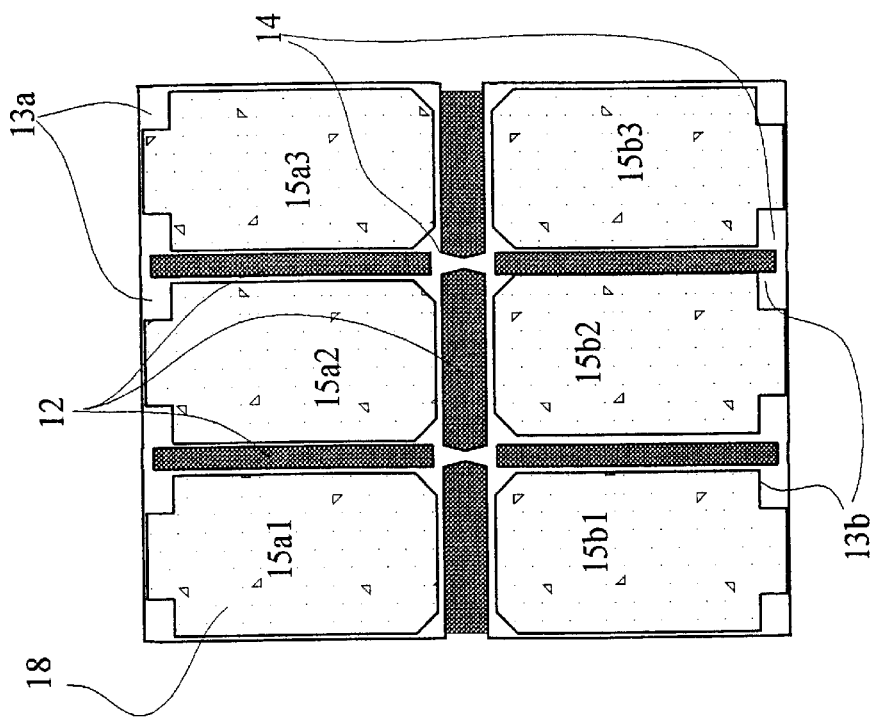
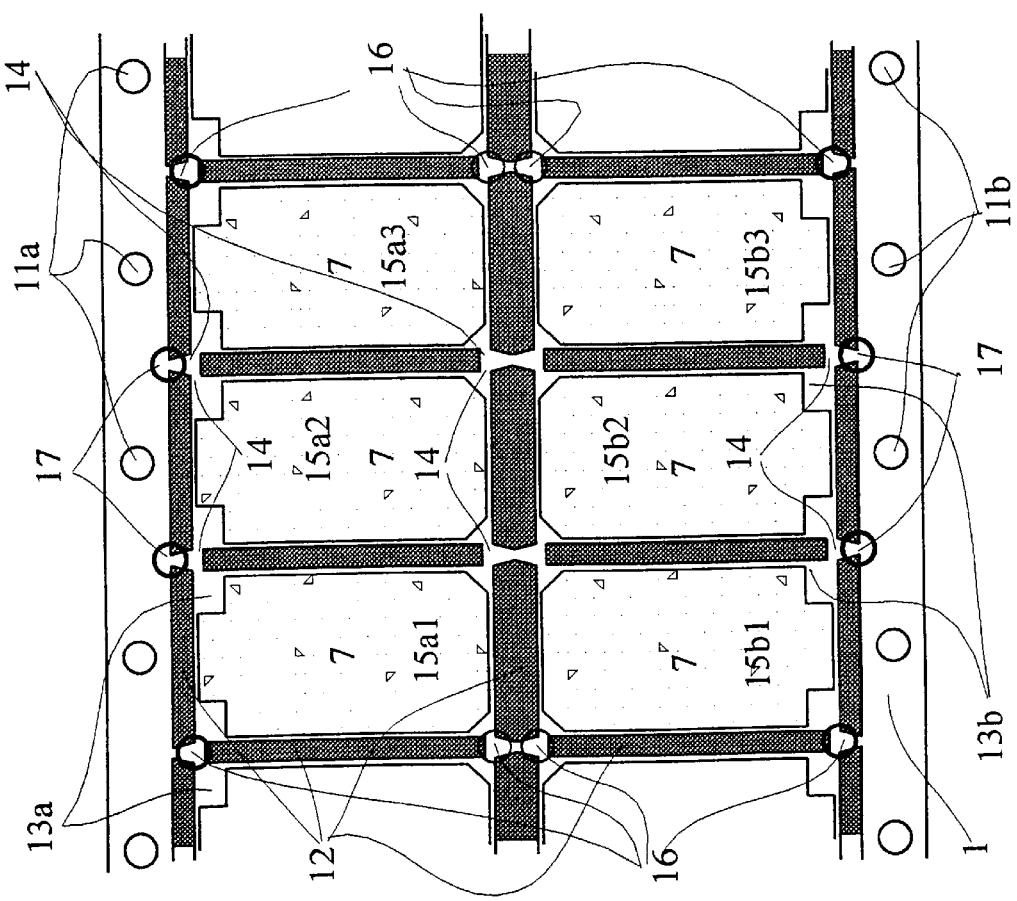

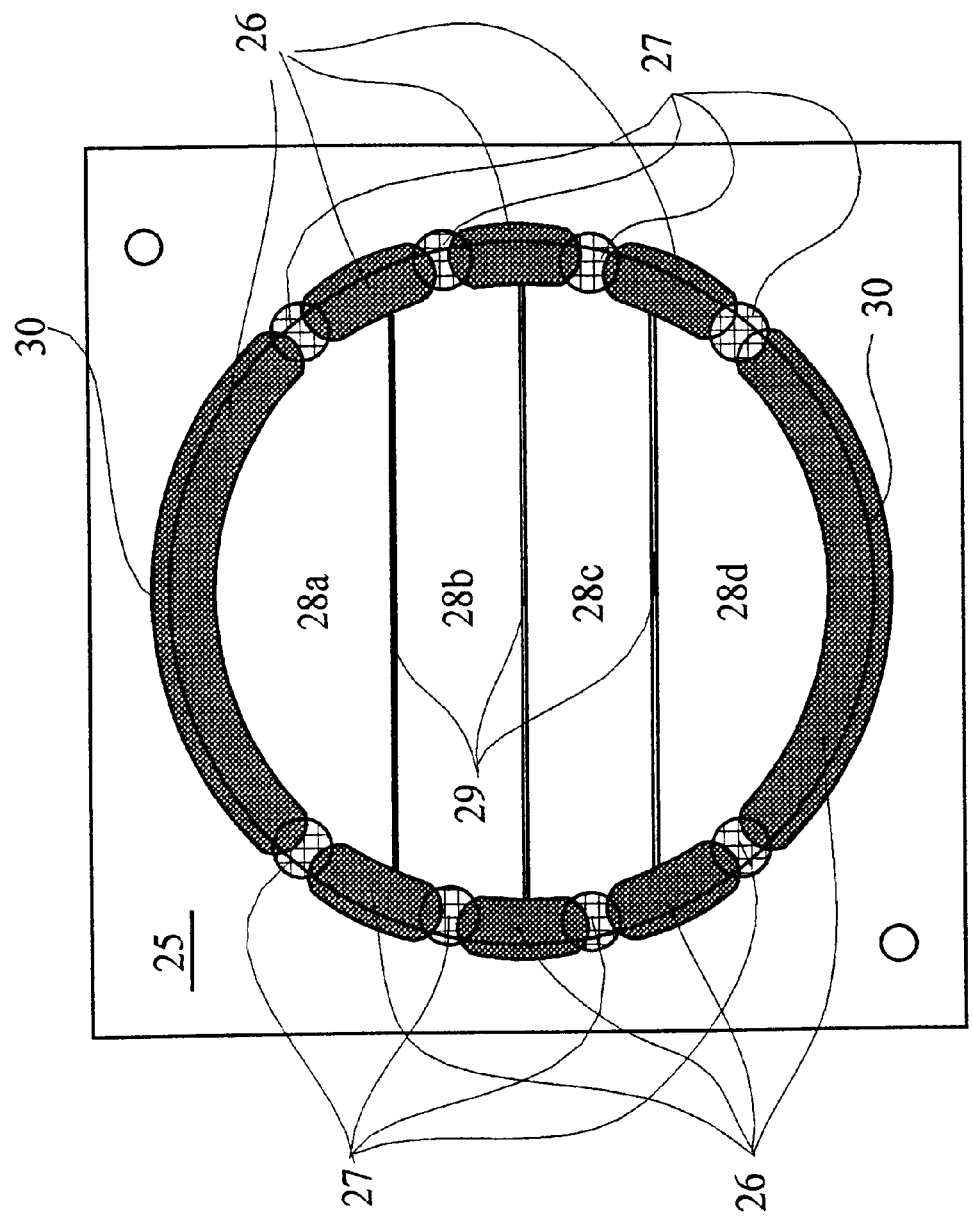

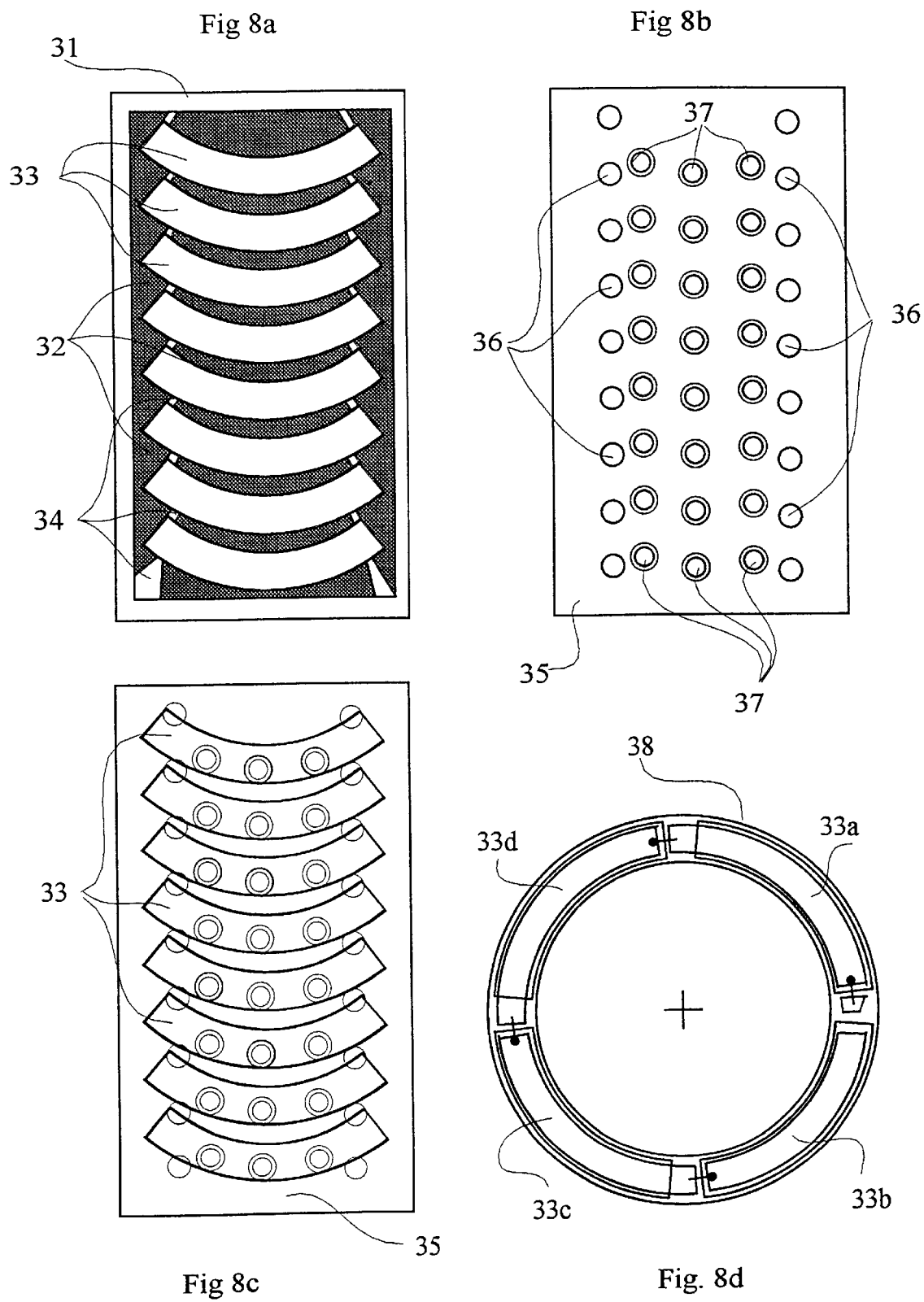

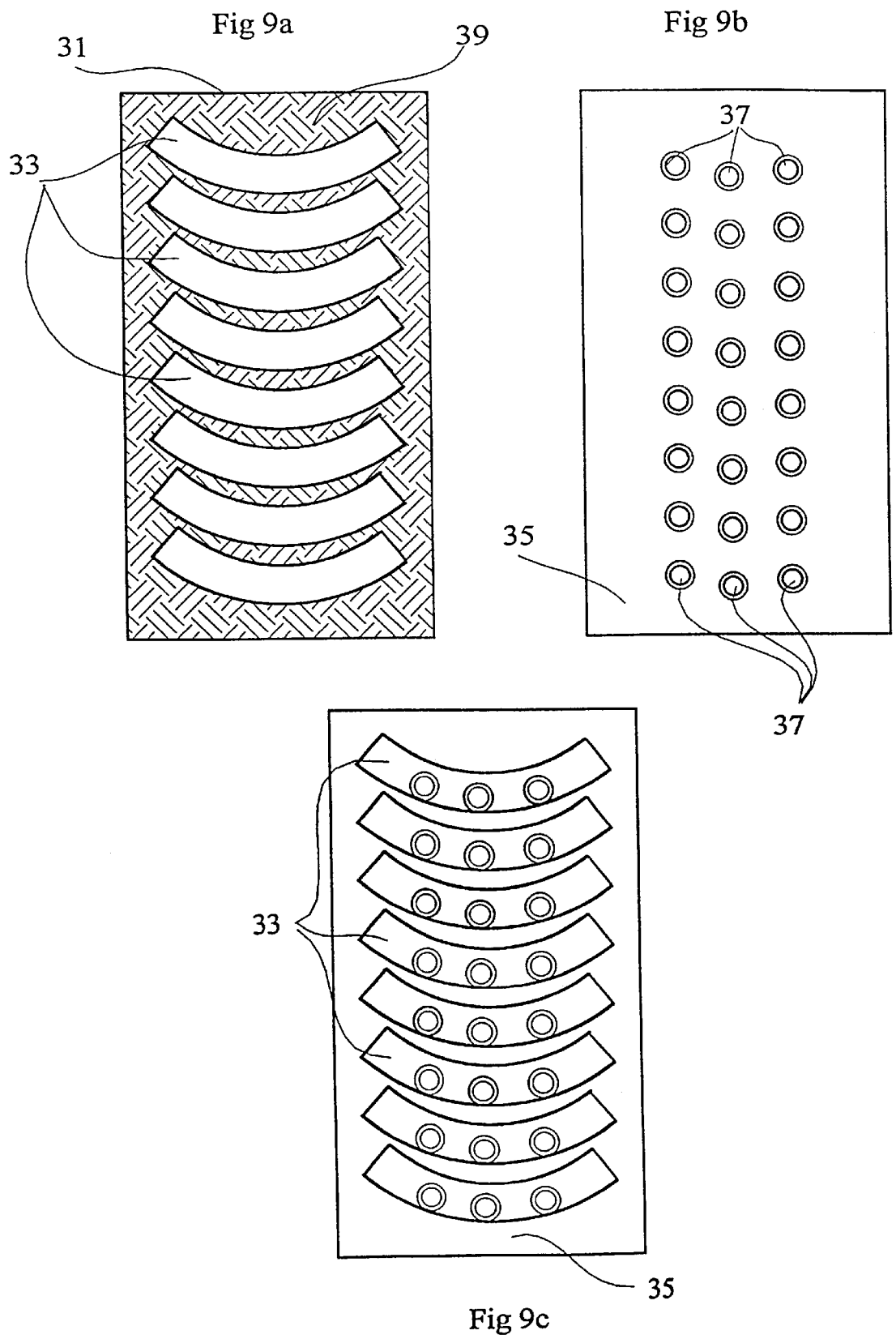

METHOD FOR MANUFACTURING AND ASSEMBLING PHOTOVOLTAIC CELLS

BACKGROUND OF THE INVENTION

The present invention concerns a method for manufacturing and assembling photovoltaic cells in silicon on a metal substrate.

Making photovoltaic cells in crystalline silicon on silicon plates in the same way as integrated circuits is known. Such cells are relatively expensive and the surface thereof is limited to several tens of $mm^2$. Moreover, they cannot be set in series directly on the base plate since the latter forms a common electrode for all the cells. They must first of all be separated by sawing, then assembled and electrically connected on an interconnection support, for example a printed circuit. Such a stamping method is disclosed for example in Japanese patent application JP-A-62025463. Sawing takes place after the silicon plate has been bonded to a drumskin on which the cells remain fixed, which facilitates the handling thereof during assembly.

Photovoltaic cells can also be made by depositing layers of amorphous silicon on a substrate ad hoc, for example, made of glass. This method is advantageous since it allows cells with a larger surface to be economically obtained. Moreover, it is possible to make cell assemblies in series directly on the glass support. However, for certain applications, the glass is too fragile, especially if its thickness has to be reduced to less than 1 mm. The support on a metal base, for example made of stainless steel, then represents a very interesting alternative. However, the fact that the base is conductive, unlike glass, poses a certain number of difficult problems, especially as regards setting the cells in series.

SUMMARY OF THE INVENTION

The object of the present invention is to overcome these problems.

More precisely, the invention concerns a method for manufacturing and assembling individual silicon photovoltaic cells on a metal substrate, characterised in that it includes the operations of:

making a metal plate provided with cut out portions delimiting the bases of a plurality of individual cells, said cut out portions being connected to each other and to said plate by points of attachment;

depositing on said plate a stack of silicon layers;

depositing on said stack a substantially transparent conductive layer, sparing at least the zones facing the points of attachment and if required, the adjacent zones of the cut out portions so as to form a set of individual photovoltaic cells which are electrically separated both from each other and at their top electrode formed by said conductive layer;

removing a group of individual cells from said assembly by perforating the points of attachment connecting said group to said metal plate;

transferring and securing the removed group of cells onto an interconnection support;

perforating the points of attachment still connecting the cells of said group to each other so as to separate them electrically at their bottom electrode formed by said metal plate; and interconnecting said cells.

According to a first variant, the method according to the invention is characterised in that it includes the operations of:

making a metal plate provided with cut out portions delimiting the bases of a plurality of individual cells, said cut out portions being connected to each other and to said plate by points of attachment;

depositing a stack of silicon layers on said plate;

depositing on said stack a substantially transparent conductive layer sparing at least the zones facing the points of attachment and if required, the adjacent zones of the cut out portions so as to form a set of individual photovoltaic cells which are electrically separated both from each other and at their top electrode formed by said conductive layer;

removing a group of individual cells from said assembly by perforating the points of attachment connecting said group to said metal plate;

transferring and provisionally securing the removed group of cells onto an interconnection support;

perforating the points of attachment still connecting the cells of said group to each other so as to separate them electrically at their bottom electrode formed by said metal plate;

transferring and securing said cells one by one onto an interconnection support, and interconnecting said cells.

According to a second variant, the method according to the invention is characterised in that it includes the operations of:

making a metal plate provided with cut out portions totally freeing the bases of a plurality of individual cells, said bases being then pushed back into the metal plate opposite said cut out portions;

depositing a stack of silicon layers on said plate;

depositing on said stack a substantially transparent conductive layer sparing at least the zones facing the points of attachment and if required, the adjacent zones of the cut out portions so as to form a set of individual photovoltaic cells which are electrically separated both from each other and at their top electrode formed by said conductive layer;

transferring and securing a group of individual cells onto an interconnection support;

removing said cells from the metal plate so as to separate them electrically at their bottom electrode formed by said plate; and interconnecting said cells.

Finally according to a third variant, the method according to the invention is characterised in that it includes the operations of:

making a metal plate provided with cut out portions totally freeing the bases of a plurality of individual cells, said bases then being pushed back into the metal plate opposite said cut out portions;

depositing a stack of silicon layers on said plate;

depositing on said stack a substantially transparent conductive layer sparing at least the zones facing the points of attachment and if required, the adjacent zones of the cut out portions so as to form a set of individual photovoltaic cells which are electrically separated both from each other and at their top electrode formed by said conductive layer;

transferring and provisionally securing a group of individual cells onto an intermediate support;

removing said cells from metal plate so as to separate them electrically at their bottom electrode formed by said metal plate;

transferring and securing cells one by one onto an interconnection support; and interconnecting said cells.

Advantageously, the method according to the invention also has the following features:

the operation of transferring and securing onto the interconnection support includes the electric connection of the metal base of the cells onto said support by means of a conductive adhesive material;

the cut out portions of the metal plate are made by stamping;

the interconnection of the cell is achieved by tapes including a plurality of parallel conductors electrically connecting contact zones of the cells to corresponding contact zones of the interconnection support via anisotropic conductive adhesive material.

BRIEF DESCRIPTION OF THE DRAWINGS

The invention will be better understood upon reading the following description, given by way of explanation and with reference to the annexed drawings, in which:

FIG. 1 is a cross-section of two photovoltaic cells set in series in a conventional manner;

FIG. 2 is a simplified cross-section of cells made according to the invention;

FIGS. 3, 4, 5 and 6 illustrate a first example implementation of the method according to the invention;

FIG. 7 illustrates a second example implementation of the method according to the invention;

FIG. 8 illustrates a third example implementation of the invention; finally

FIG. 9 shows a variant of the implementation of FIG. 8.

Figure 6:
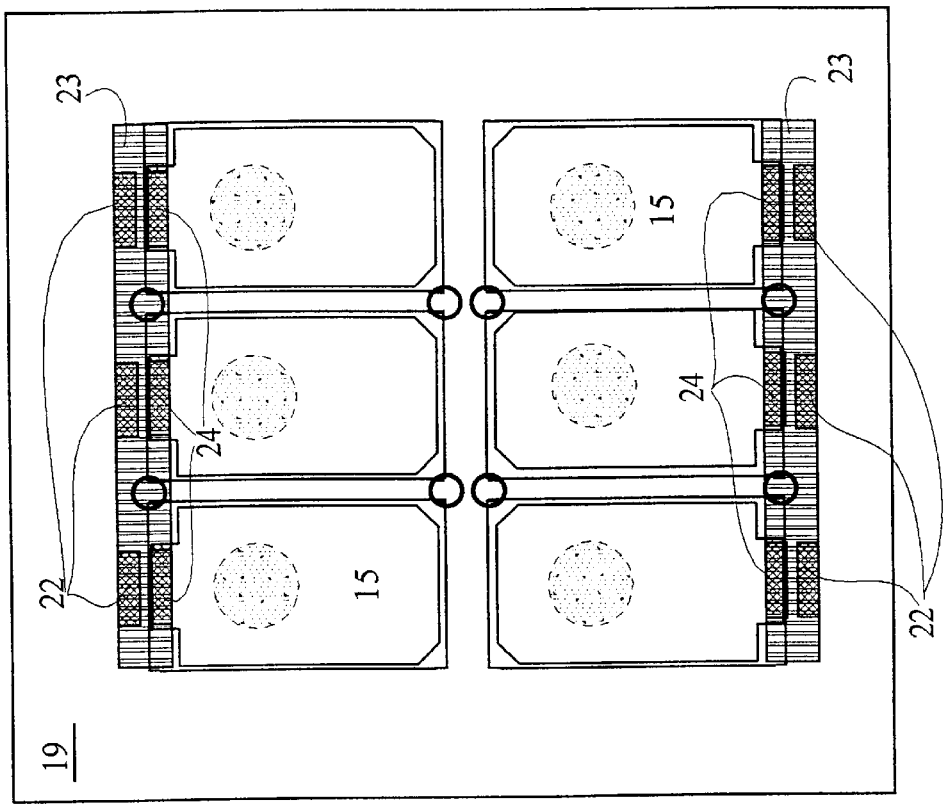

Reference will be made first of all to FIG. 1 which shows two silicon photovoltaic cells set in series in accordance with the current techniques. A metal substrate 1, generally made of stainless steel, is covered with an insulating layer 2, then a metallisation 3 used to form the bottom poles of the cells. A stack of three layers of amorphous PIN or NIP silicon 4, 5 and 6 are then found, which form the actual cells. The assembly is finally covered with a transparent or semi-transparent metallisation 7 used to form the top poles of the cells while allowing light to pass through.

It will be noted that, in the drawing, proportions have not been respected. Stainless steel substrate 1 may, in fact, have a thickness of several tens of millimetres, while layers 2 to 7 have a thickness of considerably less than a micron.

DETAILED DESCRIPTION OF THE INVENTION

According to the current techniques, once the different layers have been deposited, individual cells are made by the selective removal of layers 3 to 7 at location 8 where the separation occurs. Finally, top metallisation 7 of each cell is electrically connected by a connection 9 to bottom metallisation 3 of the following cell in order to set in series the group of photovoltaic cells concerned. U.S. Pat. No. 5,457,057 discloses such a method for selectively removing layers so that a plurality of cells can remain connected to each other via their metal base which forms bottom electrode, without risking a short circuit upon their subsequent separation.

The separation of the cells occurs in accordance with various methods, in particular by laser cutting or photolithography. These techniques will not be described here since they do not directly concern the object of the invention. It should however be noted that all these methods require a high number of sometimes very complex operations.

Via a different approach, the method according to the invention proposes a real simplification. As FIG. 2 shows, the three PIN or NIP amorphous silicon layers 4, 5 and 6 are then directly deposited on metal substrate 1, which is advantageously made of stainless steel, which has previously undergone stamping, the reasons for which will appear hereinafter.

Transparent or semi-transparent metallisation layer 7 is then selectively deposited, by means well known to those skilled in the art, on zones having the shape and dimension of the individual cells which it is sought to obtain. The portions which are not covered by layer 7 are designated by the reference 10. By way of variant, it is also possible to deposit layer 7 over the entire surface of the stack of silicon layers then make portions 10 by the selective removal of the metallisation while protecting the useful zones.

It will be noted that insulating layer 2 and metallisation 3 used in the cells of the prior art are omitted, which, of course, substantially lightens the manufacturing process. It is thus steel substrate 1 which directly acts as the bottom pole of the cells.

When these operations have been performed, one thus has a large single cell which substantially covers the entire surface of metal support 1, i.e. up to several square decimetres. It then remains to cut out elements of the desired dimensions from the base plate.

This is where the main problems lie. Indeed, because of the difficulty of sawing and drilling stainless steel, have to be excluded. It is thus not possible to use sawing on drumskin as for crystalline silicon plates. Laser or water jet cutting is possible, but often unreasonable. Moreover, one has to avoid having the cells loose, as they are likely to become damaged by rubbing against each other, and the handling thereof during assembly operations becomes problematic and costly.

As will now be described, the present invention overcomes this problem, by initially forming by stamping, in steel plate 1, cut out portions which define the size and shape of the individual cells to be made. These cut out portions are not however complete but allow a set of points of attachment to remain which hold the structure in place.

Reference will now be made to FIG. 3 showing a stainless steel substrate 1 formed of a tape which includes, on each side, a series of regularly spaced indexing holes 11a and 11b which, in the example shown, face each other in pairs, without however this being indispensable. These holes allow partial rectilinear cut out portions 12 to be made by stamping, said portions 12 being shown hatched, for the clarity of the drawing. These cut out portions delimit bases 13a and 13b of two rows of rectangular cells held connected to tape 1 at each of their angles by four points of attachment 14. Each pair of indexing holes 11a and 11b corresponds to two individual cell bases 13a and 13b. Thus, a tape including 30 indexing positions will include 60 individual cell bases.

Tape 1 is stamped prior to deposition of the layers of amorphous silicon, and before metallisation 7 and the portions exempt therefrom are made.

When metallisation 7 and the portions exempt therefrom are made, one must ensure that this metallisation does not cover points of attachment 14 to prevent creating shortcircuits during the final cutting. The technique used for this purpose is the same as that allowing the non metallised portions to be made.

Once these operations have been performed, one has a set of individual cells a group of which then has to be isolated by perforating the different points of attachment 14 at well determined locations.

The example illustrated in FIG. 3 will be taken, which shows how to form a group of three pairs of cells designated by the references 15a1–15b1, 15a2–15b2 and 15a3–15b3.

By punching, one will then form, on the eight points of attachment 14, between the group of cells concerned and the other cells of tape 1, eight perforations 16 which detach the group both from the tape and the adjacent cell outside the group.

By the same punching operation, one then makes, on the four points of attachment 14 between the group of cells concerned and tape 1 itself, four perforations 17 which detach the group only from the tape but leave the cells of the group attached to each other.

Group 18 of the six cells 15a1, 15a2, 15a3, 15b1, 15b2, 15b3 thereby removed from the tape is shown in FIG. 4. Of course, these cells are still electrically assembled in parallel. They must therefore be separated, as will now be described.

Figure 5:
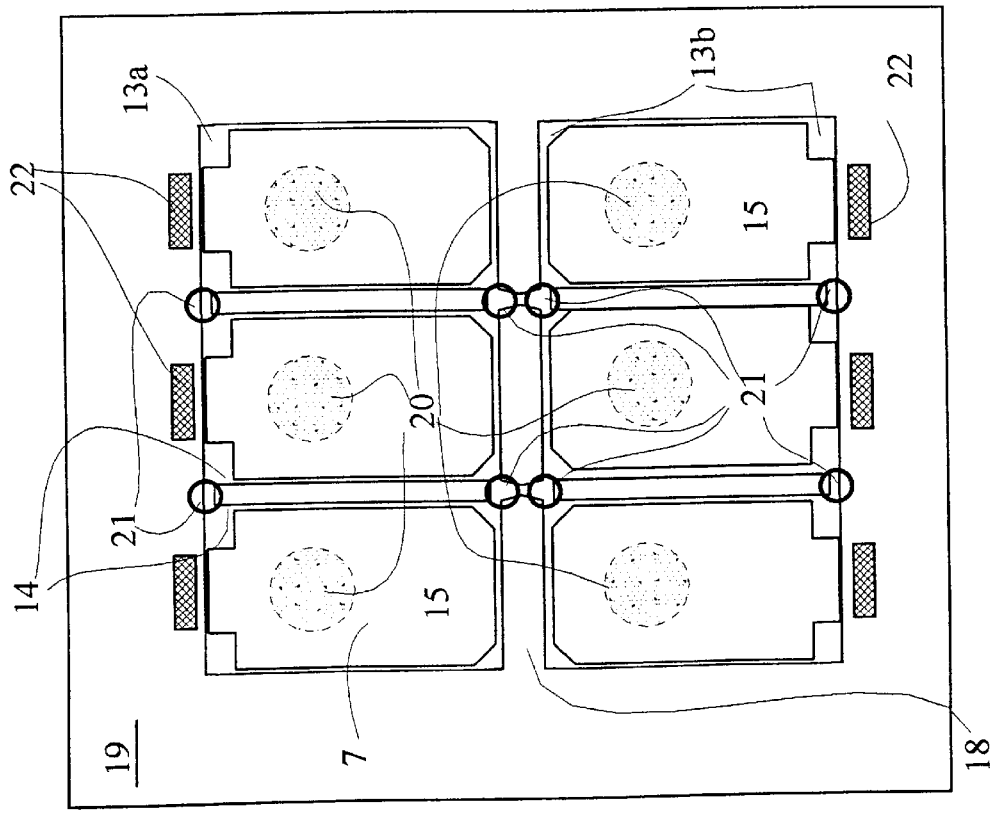

FIG. 5 shows that group 18 of the six cells 15 is then transferred onto an interconnection support or printed circuit 19 to which it is bonded by means of conductive adhesive material, so that the bottom poles of each cell (i.e. bases 13a and 13b made of steel) are electrically connected to corresponding contacts 20 of printed circuit 19.

Then, via a last punching operation, on the eight points of attachment 14 which still connect cells 15 to each other, eight perforations 21 are advantageously made through openings provided in printed circuit 19. These perforations thus make the six cells totally separate from each other. They may then be set in series or in parallel, according to the connection diagram defined by printed circuit 19.

It remains only to connect the top poles of cells 15, formed by metallisations 7, to the corresponding zones of printed circuit 19. For this purpose, the latter includes, beside each cell, contact zones 22 to which metallisations 7 have to be connected. As FIG. 6 shows, this connection can be achieved, for example, by means of two tapes 23 including parallel conductors 24, which cover the two sets of contact zones 22 and the ends of the adjacent metallisations 7. The electric junction between zones 22 and metallisations 7 is assured by the anisotropic conductive adhesive material, as is done for electrically connecting LCD displays. It is clear however that other connection methods can be used, for example by using simple wires fixed either side by a drop of conductive adhesive material.

FIG. 7 illustrates the way in which the method according to the invention can be applied to making groups of cells having particular aesthetic features. Stamping the steel base support allows very varied shapes to be obtained.

In this example, a stainless steel substrate 25 is shown in which eight cut out portions 26, forming a circle and separated by eight points of attachment 27, have been made by stamping. The circle itself is separated into four zones defining a group of four cells 28a, 28b, 28c and 28d. In order to preserve the aesthetic appearance of the assembly which is intended, for example, to become a watch dial, the cut out portions 29 separating the cells are advantageously made by means of a laser, which allows much finer slits to be made than by stamping. The whole assembly is secured to a printed interconnection circuit 30 of slightly larger diameter than that of the circle formed by the four cells. This will then allow the connections to be made with their top poles in the space arranged between the circle and the printed circuit.

The eight points of attachment 27 will finally be perforated by punching in order to separate the group of cells from the rest of base plate 25. The periphery of the assembly may advantageously be covered by a circle intended to conceal the interconnections.

It can be seen that it is possible, according to the invention, to make groups of cells of varied shaped having, if required, an improved aesthetic appearance.

There exist however cases in which it is difficult to make groups of cells directly. It is then necessary to use an intermediate support, as described in FIG. 8.

FIG. 8a shows a steel substrate 31 in which cut out portions 32 have been made by stamping, allowing a set of cells 33, which have the shape of a quarter of a circle and are joined by points of attachment 34, to be made.

An intermediate support 35 is used, shown in FIG. 8b, which is able to accommodate the set of cells. This support is formed, for example, by an epoxy resin plate, which includes several rows of holes. Two rows of holes 36, arranged so as to be located facing points of attachment 34, are provided to allow the passage of cutting punches from these points. The support also includes three other rows of holes 37 with glued edges, the use of which will appear hereinafter.

The assembly of FIG. 8a is placed on intermediate support 35 where cells 33 come into contact with adhesive material arranged around holes 37, which assures the immobilisation thereof. Points of attachment 34 are then cut out by punching through holes 36 so as to remove the rest from steel substrate 31.

As FIG. 8c shows, cells 33, completely separate from each other, thus remain held on intermediate support 35 from which they will then be able to be picked up by a suitable mounting robot advantageously fitted with a suction head allowing them to be set in place on their interconnection support according to any desired configuration. In order to facilitate the picking up of cells 33, they may be pushed from behind by means of extractors passing through holes 37.

As shown in FIG. 8d, four of these cells 33a, 33b, 33c and 33d are arranged in a circle on an interconnection support 38 in the shape of a crown, after which they are finally interconnected in series.

Making components, for example dials, from metal bases which are completely cut out by stamping then put back in place—or pushed back—into the support from which they come, is well known in the watchmaking industry. Since stamping occurs without removing any material, the part fits perfectly back into place and it is held sufficiently well to assure the subsequent operations.

FIG. 9 illustrates another implementation of the invention, which uses the above technique. In order to allow comparison, the method is applied to the manufacture of the same cells as in the case of FIG. 8. For this reason, the same elements have been designated by the same references.

As FIG. 9a shows, cells 33 are completely cut out from steel plate 31 then pushed back into it. It can thus be seen that points of attachment 34 between the cells no longer exists. Intermediate support 35 of FIG. 9b is consequently exempt from holes 36 for the passage of the punches for cutting the points of attachment.

When the assembly of FIG. 9a is then placed on support 35, cells 33 are secured to the adhesive material arranged around holes 37. It then remains only to detach the rest from substrate 31 to obtain the assembly of FIG. 9c from which the cells will be able to be picked up one by one to be finally deposited on the interconnection support.

Of course, the same technique also applies in other embodiments of the invention, when no intermediate support is used and the groups of cells are directly transferred onto the interconnection support.

It can thus be seen that the method according to the invention, in addition to being simple to implement, allows numerous alternative embodiments which are not possible with the methods known until now.

What is claimed is:

1. A method for manufacturing an assembly of individual silicon photovoltaic cells on a metal substrate, and interconnecting a group of cells of said assembly on a support characterised in that it includes the successive steps of:

making a metal plate provided with cut out portions delimiting bases of a plurality of non-adjoining individual cells, said cut out portions holding said cells in said plate by points of attachment arranged in a non-adjoining manner or by provisional blocking in said cut out portions;

depositing on said plate a stack of silicon layers;

depositing on said stack a substantially transparent conductive layer forming a top transparent electrode, sparing at least zones facing the points of attachment and if required, adjacent zones of the cut out portions so as to form a set of individual photovoltaic cells which are electrically separated both from each other and at their top electrodes;

removing a group of individual cells from said set;

transferring and securing the removed group of cells onto an interconnection support;

electrically separating cells of said removed group at said metal plate to form bottom electrodes for these cells; and interconnecting the cells.

2. The method according to claim 1, wherein the bottom electrodes are connected to each other by points of attachment of the metal plate, characterised in that the removal of a group of individual cells is achieved by perforation of peripheral points of attachment connecting said group of individual cells to said plate and in that the separation of the bottom electrodes is achieved by perforation of other points of attachment still connecting the cells of said group to each other.

3. The method according to claim 1, wherein the bottom electrodes of a cell assembly are connected to each other by blocking at the cut out portions while being totally cut and pushed back into the plate, characterised in that the electrical separation of the bottom electrodes is achieved by removal of portions of the plate no longer forming said bottom electrodes.

4. The method according to claim 1, characterised in that said step of transferring and securing the cells onto the interconnection support includes the electric connection of metal bases of the cells, formed by said metal plate, onto said support by means of a conductive adhesive material.

5. The method according to claim 1, characterised in that the cut out portions of the metal plate are made by stamping.

6. The method according to claim 1, characterised in that said interconnecting step is achieved by tapes including a plurality of parallel conductors electrically connecting contact zones of the separated cells to corresponding contact zones of the interconnection support via anisotropic conductive adhesive material.

7. A method for manufacturing an assembly of silicon photovoltaic cells on a metal substrate, and interconnecting individual cells from a group of said assembly on a support characterised in that it includes the successive steps of:

making a metal plate provided with cut out portions delimiting bases of a plurality of non-adjoining individual cells, said cut out portions holding said cells in said plate by points of attachment arranged in a non-adjoining manner or by provisional blocking in said cut out portions;

depositing on said plate a stack of silicon layers;

depositing on said stack a substantially transparent conductive layer forming a top transparent electrode, sparing at least zones facing the points of attachment and if required, adjacent zones of the cut out portions so as to form a set of individual photovoltaic cells which are electrically separated both from each other and at their top electrodes;

removing a group of individual cells from said set;

electrically separating cells of said removed group at said metal plate to form bottom electrodes for these cells;

transferring and securing the removed group of individual cells onto an interconnection support; and interconnecting the cells, wherein said step of electrically separating the cells is achieved by transferring and provisionally securing the removed group of cells onto an intermediate support from which they are subsequently removed to be transferred and secured one by one onto the interconnection support.

8. The method according to claim 7, wherein the bottom electrodes are connected to each other by points of attachment of the metal plate, characterised in that the step of removing a group of individual cells is achieved by perforation of peripheral points of attachment connecting said group of individual cells to said plate, and in that the step of separating the bottom electrodes is achieved by perforation of other points of attachment still connecting the cells of said group to each other.

9. The method according to claim 7, characterised in that said step of transferring and securing the cells onto the interconnection support includes the electric connection of metal bases of the cells, formed by said metal plate, onto said support by means of a conductive adhesive material.

10. The method according to claim 7, characterised in that the cut out portions of the metal plate are made by stamping.

11. The method according to claim 7, characterised in that said step of interconnecting is achieved by tapes including a plurality of parallel conductors electrically connecting contact zones of the separated cells to corresponding contact zones of the interconnection support via anisotropic conductive adhesive material.

12. A method for manufacturing an assembly of individual silicon photovoltaic cells on a metal substrate, and interconnecting a group of cells of said assembly on a support characterised in that it includes the successive steps of:

making a metal plate provided with cut out portions delimiting bases of a plurality of non-adjoining individual cells, said cut out portions holding said cells in said plate by points of attachment arranged in a non-adjoining manner or by provisional blocking in said cut out portions;

depositing on said plate a stack of silicon layers;

depositing on said stack a substantially transparent conductive layer forming a top transparent electrode, sparing at least zones facing the points of attachment and if required, adjacent zones of the cut out portions so as to form a set of individual photovoltaic cells which are electrically separated both from each other and at their top electrodes;

transferring and provisionally securing the set of cells onto an intermediate support;

electrically separating the transferred and provisionally secured set of cells at said metal plate to form bottom electrodes for these cells;

transferring and securing a group of cells with bottom electrodes onto an interconnection support; and interconnecting the cells.

13. The method according to claim 11, wherein the bottom electrodes are connected to each other by-points of attachment of the metal plate, characterised in that the step of removing a group of individual cells is achieved by perforation of peripheral points of attachment connecting said group of individual cells to said plate, and in that the step of separating the bottom electrodes is achieved by perforation of other points of attachment still connecting the cells of said group to each other.

14. The method according to claim 11, characterised in that said step of transferring and securing the cells onto the interconnection support includes the electric connection of metal bases of the cells, formed by said metal plate, onto said support by means of a conductive adhesive material.

15. The method according to claim 11, characterised in that the cut out portions of the metal plate are made by stamping.

* * * * *